(12) United States Patent
Eidson et al.

(10) Patent No.: US 6,307,894 B2
(45) Date of Patent: *Oct. 23, 2001

(54) POWER AMPLIFICATION USING A DIRECT-UPCONVERTING QUADRATURE MIXER TOPOLOGY

(75) Inventors: Donald Brian Eidson; Robert Edmund Grange, both of San Diego, CA (US)

(73) Assignee: Conexant Systems, Inc., Newport Beach, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/318,482

(22) Filed: May 25, 1999

(51) Int. Cl.[7] .............. H04K 1/02; H04L 25/03; H04L 25/49

(52) U.S. Cl. ............... 375/297; 375/298; 375/302

(58) Field of Search .................. 375/297, 295, 375/302, 298; 455/118, 333, 127, 103, 110, 112; 327/355, 357, 359, 556, 113, 116

(56) References Cited

U.S. PATENT DOCUMENTS

| | | | |
|---|---|---|---|
| 4,079,415 | * 3/1978 | Will | 348/11 |
| 4,907,005 | * 3/1990 | Redlich | 342/413 |
| 5,083,050 | * 1/1992 | Vasile | 327/113 |
| 5,218,322 | * 6/1993 | Allison et al. | 330/286 |
| 5,515,014 | * 5/1996 | Troutman | 332/178 |
| 5,530,722 | * 6/1996 | Dent | 375/298 |
| 5,768,700 | * 6/1998 | Kardontchik | 455/333 |
| 5,812,591 | * 9/1998 | Shumaker et al. | 375/206 |
| 5,909,460 | * 6/1999 | Dent | 375/200 |

OTHER PUBLICATIONS

Wofff et al, "Microwave Engineering and System Applications", Copyright 1988 by John Wiley & Sons, Inc., pp. 387–388.*

* cited by examiner

*Primary Examiner*—Chi Pham
*Assistant Examiner*—Phuong Phu

(57) ABSTRACT

A power amplifier for use in a wireless communication system operates like a quadrature mixer with conversion gain. The amplifier includes a local oscillator that generates two reference signals 90° out of phase with respect to each other. Four quadrature mixer elements receive signals representing the in-phase and quadrature components of a baseband signal. Each quadrature mixer amplifies the in-phase or the quadrature component of the baseband signal while upconverting with the corresponding reference signal.

56 Claims, 3 Drawing Sheets

US 6,307,894 B2

POWER AMPLIFICATION USING A DIRECT-UPCONVERTING QUADRATURE MIXER TOPOLOGY

TECHNICAL FIELD

This invention relates to wireless communications and, more particularly, to power amplification using a direct-upconverting quadrature mixer topology.

BACKGROUND

A conventional power amplifier (PA) in a digital wireless transceiver receives and then amplifies a radio frequency (RF) signal. For many modulation schemes, including those that comply with the IS-95, PDC, PHS, DCT and certain CDMA standards, the RF signal has a non-constant envelope, which requires the power amplifier to operate with a high degree of linearity over a large dynamic range. As a result, the conventional power amplifier usually is biased for operation between the Class A and Class B modes. The best case (asymptotic) efficiency of a PA operating in this manner usually lies between 50% and 78% for constant envelope signals; the efficiency is even lower for non-constant envelope signals.

U.S. patent application Ser. No. 09/108,628, filed on Jul. 1, 1998, by Donald Brian Eidson and Robert Edmund Grange, and titled "Envelope Feedforward Technique with Power Control for Efficient Linear RF Power Amplification," discloses a power amplification technique that allows operation in high efficiency modes (such as Class D or Class E), in some cases producing asymptotic efficiencies for constant envelope signals that approach 100%. In one implementation of this technique, a dual-gate field effect transistor (FET) acts in a manner similar to a conventional RF mixer, receiving at one dual-gate input a constant envelope RF signal containing phase component information, and receiving at the other dual-gate input an unmodulated signal containing the envelope component. In a digital system, the constant envelope RF signal and the unmodulated envelope signal are derived from the in-phase (I) and quadrature (Q) components provided by a baseband device.

SUMMARY

In one aspect, the invention features a power amplifier having a quadrature mixer and an oscillator circuit. The oscillator circuit generates two reference signals that are 90° out of phase with respect to each other. The quadrature mixer has two mixer elements that each receive one of the reference signals. Each mixer element receives a signal containing either the in-phase or the quadrature component of a baseband signal to be transmitted and uses the reference signal to upconvert and amplify the I or Q component of the baseband signal. The quadrature mixer also includes circuitry that combines the upconverted and amplified I and Q components to form an output signal.

In another aspect, the invention features a wireless transmitter that includes a baseband encoder, an oscillator circuit, and a quadrature mixer. The baseband encoder produces signals representing the in-phase and quadrature components of a baseband signal to be transmitted. The oscillator generates two reference signals that are 90° out of phase with respect to each other. The quadrature mixer uses each of the reference signals to upconvert and amplify one of the in-phase and quadrature components of the baseband signal.

In some embodiments, the reference signals have power levels much greater than the power levels of the I and Q components of the baseband signal. In these cases, the mixer elements include power elements, such as Gilbert cells or dual-gate FETs. The reference signal often drives a modulating port of the mixer, and the in-phase or quadrature component of the baseband signal often drives the reference port. In some cases, the reference port is biased to act as an ON/OFF switch, and the modulating port is biased to act as a current source. The ON/OFF switch is usually implemented as a power device.

Other embodiments include four mixer elements, each of which receives one of a group of signals representing the in-phase, negative in-phase, quadrature, and negative quadrature components of the baseband signal. In some of these embodiments, the oscillator circuit produces four reference signals, three of which are 90°, 180°, and 270° out of phase with respect to the other. A four-phase, ¼-wavelength branch tap is one tool for producing the four reference signals.

Other embodiments include a low-loss combiner coupled to the quadrature mixer elements. In some of these embodiments, the low-loss combiner includes a ceramic substrate.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference numbers and designations in the various drawings indicate like elements.

DETAILED DESCRIPTION

The power amplification technique described here uses a quadrature mixer topology to amplify the in-phase and quadrature components of a signal to be transmitted. This technique allows operation in high efficiency modes, which leads to improvements in efficiency over Class A amplifiers by a factor of two and over Class B amplifiers by a factor of $4/\pi$. Because the envelope and phase information need not be derived from the in-phase and quadrature components, this technique can be used with virtually any manufacturer's baseband circuitry for virtually any communication standard.

Through direct upconversion, this technique eliminates intermediate frequency (IF) and radio frequency (RF) circuitry in the transmit chain, which reduces the overall cost and complexity of a transmitter solution. This technique also facilitates factory tuning, since only the power amplifier (PA), and not an IF quadrature mixer, need be tuned. However, this technique differs from conventional IF mixing techniques in several ways. For example, this technique allows harmonic matching of the combiner output, as one does with a power amplifier and not a conventional mixer. This reduces the square-wave-to-sinusoidal output conversion loss associated with the mixer. Also, this technique allows cascaded gain stages here only one of the stages (e.g., the last stage) performs the mixing function.

This technique also combines high-power inputs with low-power I and Q inputs. The input impedance of an IF power amplifier at high frequencies is relatively low (typically 50 Ω) and thus requires a large drive current to operate. In contrast, the impedance seen by the I and Q inputs is relatively high because, in general, the I and Q signals contain only low frequency content. Therefore, the I and Q inputs do not require as much drive current to operate the devices that they drive. In contrast, conventional mixers tend to have IF and I-Q input impedances that are much more comparable to each other (often on the order of 1 kΩ).

Figure 1:
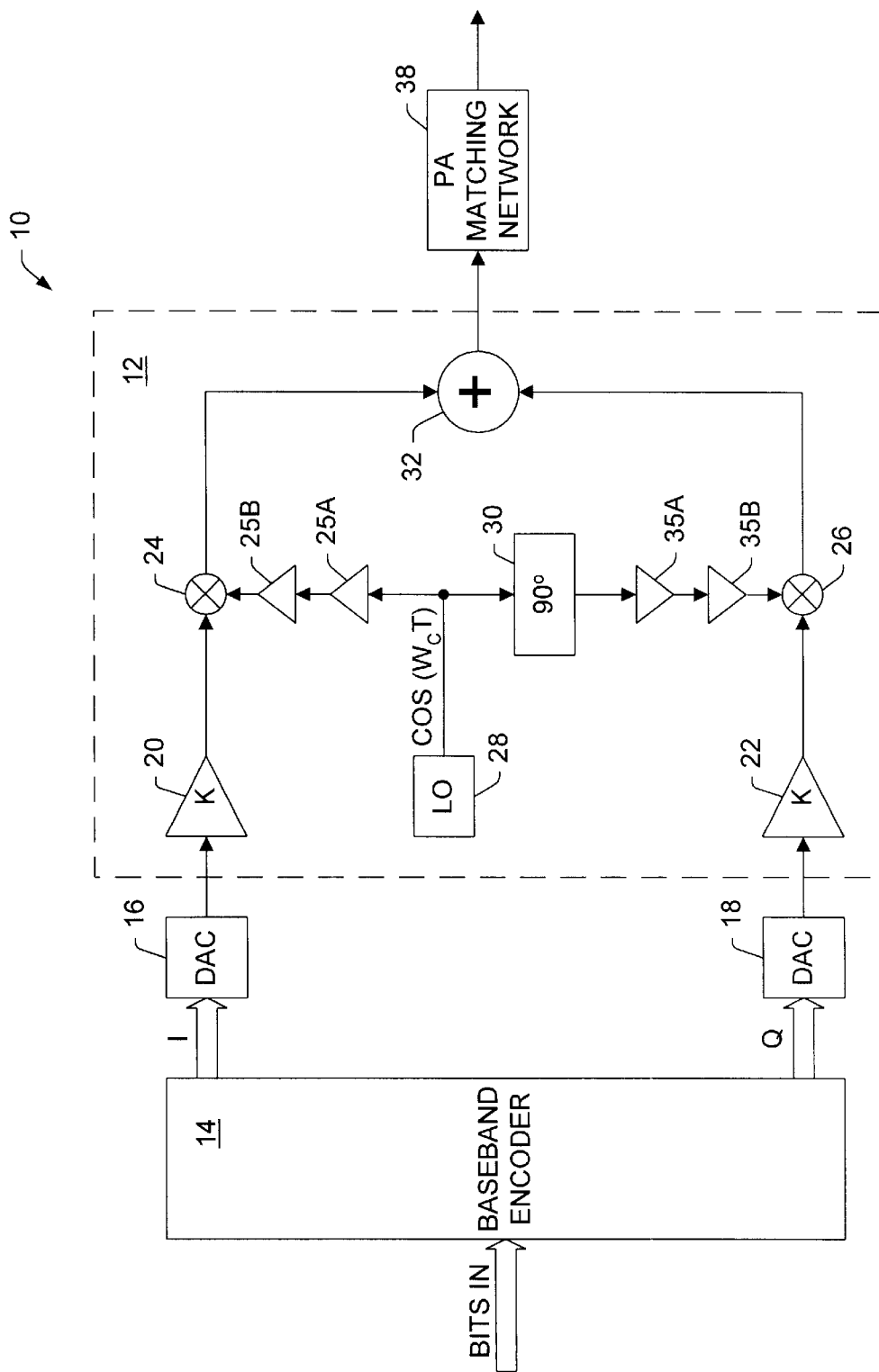
FIG. 1 is a block diagram of a power amplifier that uses a quadrature mixer topology to amplify the in-phase (I) and quadrature (Q) components of a baseband signal.

FIG. 1 shows a wireless transceiver 10 having a power amplifier (PA) 12 arranged in a quadrature mixer, or I-Q modulator, configuration. Like a conventional transceiver, this transceiver 10 includes a baseband encoder 14 that receives digital information and produces signals representing the in-phase (I) and quadrature (Q) components of the baseband signal to be transmitted. The in-phase and quadrature signals pass through digital-to-analog converters 16, 18 and gain control elements 20, 22, as they would in a conventional transceiver, in arriving at the power amplifier 12. A local oscillator 28 generates a reference signal that serves as one component ($\cos \omega_c t$) of a carrier signal at a frequency $\omega_c$. A phase delay element 30, such as a λ/4 branch tap, provides another reference signal that is 90° out of phase with the first reference signal. The second reference signal serves as another component ($\sin \omega_c t$) of the carrier signal. In most cases, the power amplifier 12 includes cascaded gain elements 25A, 25B, 35A, 35B that amplify the reference signals before providing the reference signals to mixer elements 24, 26 (described below). These cascaded gain elements provide additional gain to the power amplifier 12. For example, many mixer configurations provide only 10 dB of gain. Adding two cascaded gain elements 25A, 25B, 35A, 35B in the path of each reference signal produces additional gain on the order of 20 dB.

The power amplifier 12 includes two mixer elements 24, 26 and a signal combiner 32 that receive the in-phase and quadrature components of the baseband signal and the carrier signal and form an amplified RF signal. In many embodiments, each of the mixer elements 24, 26 is implemented as a dual-gate field effect transistor (FET), one gate of which (the upper gate) receives either the in-phase or the quadrature component of the baseband signal as input, and the other gate of which (the lower gate) receives the corresponding component of the carrier signal. In this configuration, each dual-gate FET imparts gain to the baseband signal while modulating the signal onto the carrier wave.

In one implementation, each dual-gate FET is biased to operate in the same manner as a conventional single-ended quadrature mixer with conversion gain. The lower gate of the dual-gate FET is biased to operate as a "+1/−1 switch," and the upper gate receives either the I or Q input. The top gate of each dual-gate FET is biased to support both positive and negative voltage swings of the in-phase or quadrature component of the data signal. In another implementation, the lower gate is biased to operate as an ON/OFF switch and the upper gate receives a bipolar I or Q input. A harmonic circuit on the output then recreates the waveform components which ordinarily would result from the now nonexistent "−1 swing" of the lower gate. In both of these implementations, the individual mixer stages would behave like Class A amplifiers if both negative and positive (bipolar) I and Q values were supported. In order to obtain true high efficiency operation (e.g., Class D, E, or F operation), each mixer supports only positive voltages.

The signal combiner 32 combines the modulated and amplified I and Q signals to form an output signal. The signal combiner 32 delivers the output signal to a PA matching network 38.

Figure 2:
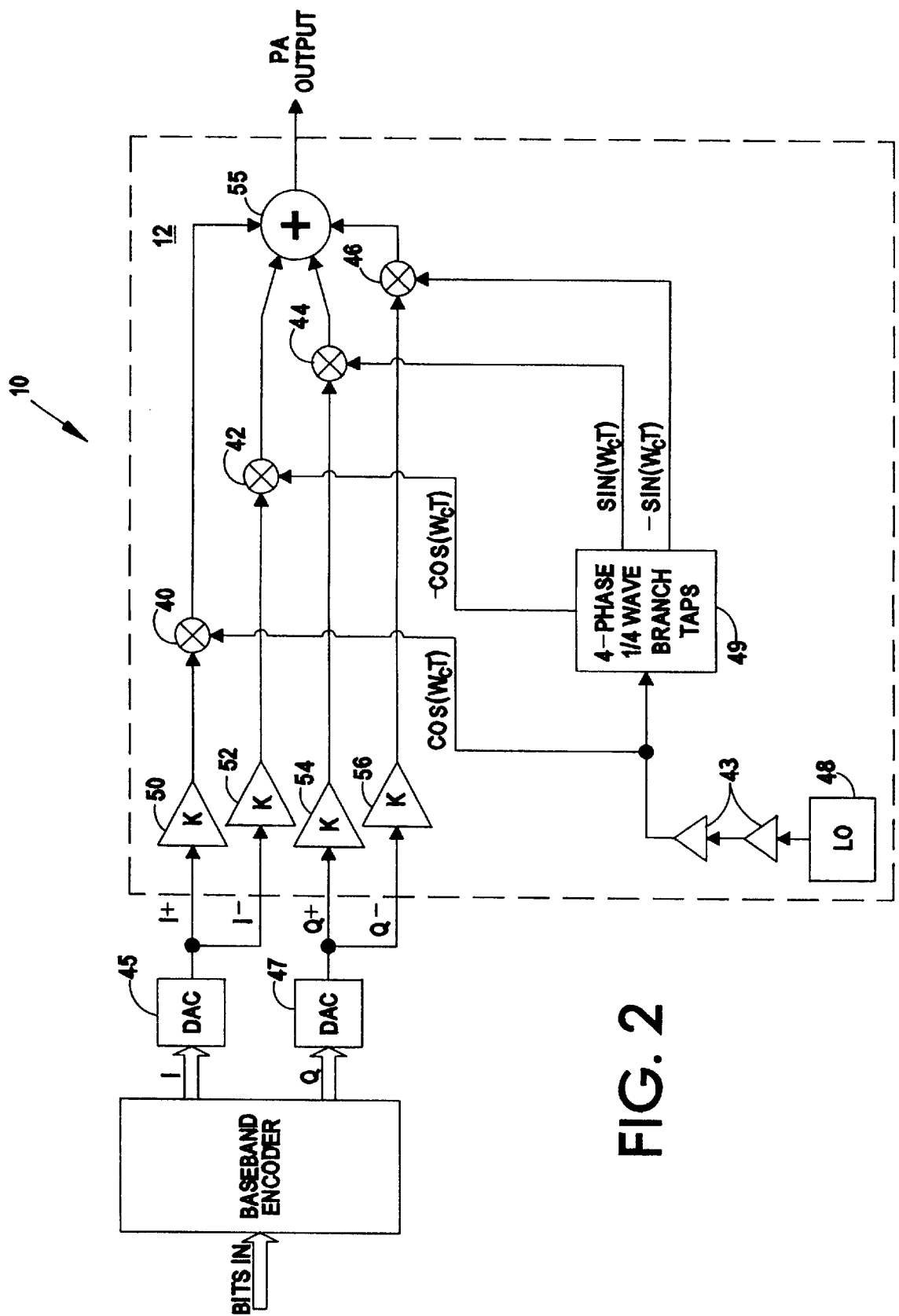
FIG. 2 is block diagram of an alternative power amplifier that uses a quadrature mixer topology to amplify the in-phase (I) and quadrature (Q) components of a baseband signal.
Figure 3:
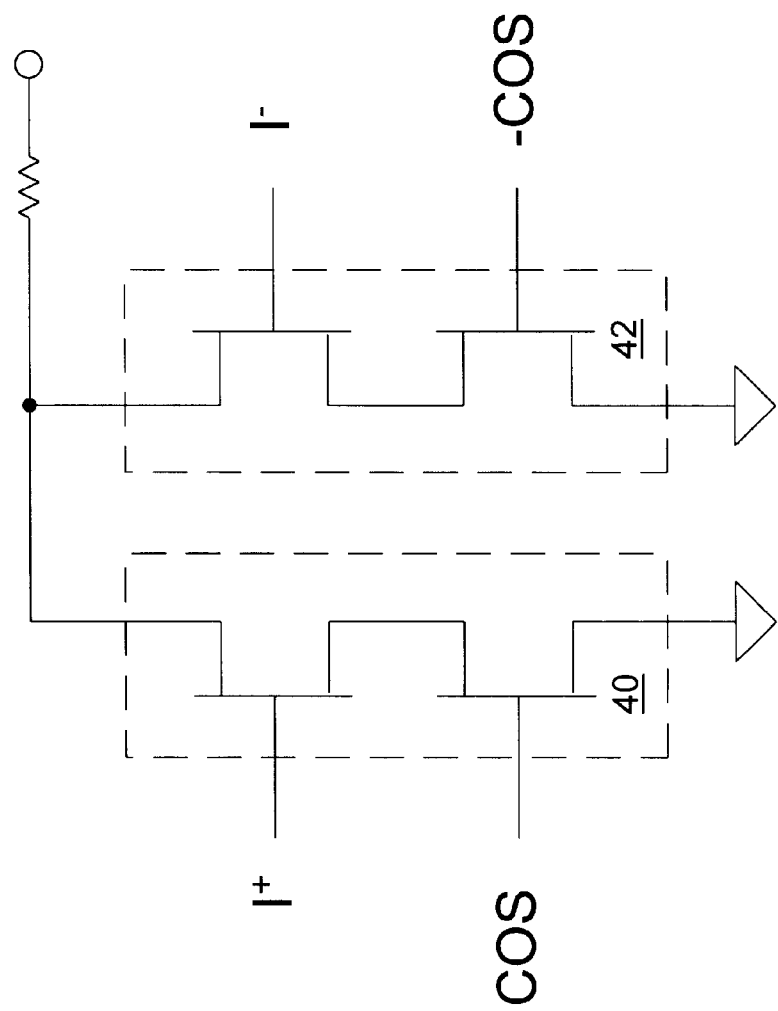
FIG. 3 is a schematic diagram of a pair of dual-gate field effect transistors (FETs) used to implement the quadrature mixer topology of FIG. 2.

FIGS. 2 and 3 show a more efficient implementation of the power amplifier 12, in which the quadrature mixer topology is carried out by four dual-gate FETs 40, 42, 44, 46 arranged in a push-pull configuration. In this configuration, two digital-to-analog converters (DACs) 45, 47 produce four differential inputs ($I^+$, $I^-$, $Q^+$, $Q^-$) representing direct and inverted versions of the in-phase and quadrature components of the baseband signal. A local oscillator 48 produces a reference signal representing the in-phase component ($\cos \omega_c t$) of the carrier waveform. A multiple phase delay element 49, such as a four-phase λ/4 branch tap, produces an inverted version of the reference signal ($-\cos \omega_c t$), as well as two other signals representing the direct and inverted quadrature components ($\sin \omega_c t$) and ($-\sin \omega_c t$) of the carrier waveform. In many cases, gain control elements 50, 52, 54, 56 are used to amplify the differential baseband signals before they reach the power amplifier. One or more cascaded gain elements 43 also can be used to amplify the reference signals.

Each dual-gate FET 40, 42, 44, 46 receives one of the baseband signal components ($I^+$, $I^-$, $Q^+$, $Q^-$) at its upper dual-gate port and the corresponding component of the carrier waveform at its lower dual-gate port. As a result, each dual-gate FET 40, 42, 44, 46 handles only positive voltages, which allows the use of n-channel devices in implementing the dual-gate FETs. A low-loss combiner 55 combines the output signals from the dual-gate FETs 40, 42, 44, 46. Implementing the combiner with a ceramic substrate improves the performance of the PA.

Figure 4:
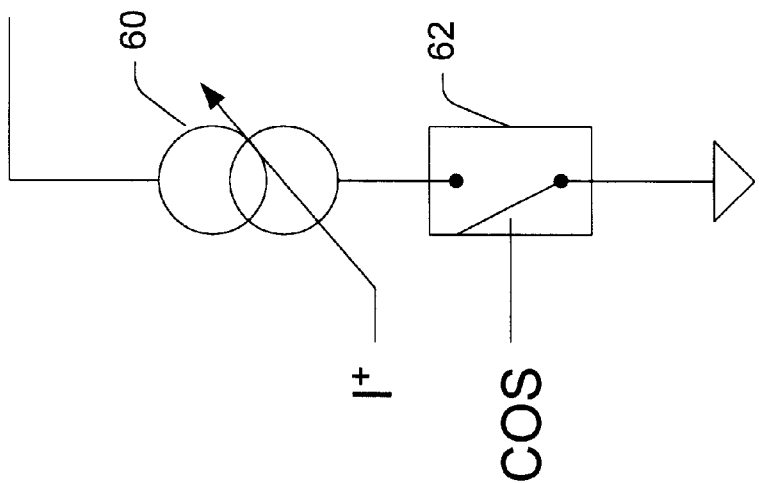
FIG. 4 is a diagram illustrating the operation of the dual-gate FETs in the arrangement of FIG. 3.

FIG. 4 shows an implementation in which each of the dual-gate FETs operates as a controlled current source 60 coupled to a single-pole, single-throw (SPST) switch 62. The sinusoidal waveform at the lower gate drives the switch, closing the switch and thus driving the output line 54 only when the waveform has a positive value. The value of the differential baseband signal at the upper gate governs the amount of current flowing through the current source 60. In this configuration, the power amplifier operates in a high efficiency mode.

A number of embodiments of the invention have been described. Nevertheless, it will be understood that various modifications may be made without departing from the spirit and scope of the invention. For example, while the invention has been described in terms of dual-gate FETs arranged in a quadrature mixer topology, other embodiments use devices such as bipolar transistors and HEMTs arranged in push-pull configurations and modeled with equivalent circuits like that shown in FIG. 4. Gilbert cell mixers with RF inputs optimized for power (i.e., with low input impedances) are used in some embodiments. In some embodiments, the gain control elements are used to amplify signals other than the baseband signals, such as the carrier signal produced by the local oscillator. Many embodiments include cascaded gain control elements to further increase power control. Accordingly, other embodiments are within the scope of the following claims.

What is claimed is:

1. A power amplifier comprising:
   (a) an oscillator circuit configured to generate reference signals that are 90° out of phase with respect to each other; and
   (b) a quadrature mixer having:
      (1) a plurality of mixer elements forming a final gain stage of the power amplifier, each connected by predetermined low impedance inputs with the oscillator circuit to receive one of the reference signals at an RF frequency, and each configured to:
         (A) receive a signal at a baseband centered frequency through relatively high impedance inputs, the signal containing either an in-phase (I) component or a quadrature (Q) component of a baseband signal to be transmitted; and
         (B) use one of the reference signals to simultaneously upconvert and amplify the in-phase or the quadrature component of the baseband signal; and
      (2) combining circuitry configured to combine the upconverted and amplified I and Q components received from the mixer elements to form an output signal.

2. The power amplifier of claim 1, wherein the reference signals have power levels much greater than the power levels of the I and Q components of the baseband signal.

3. The power amplifier of claim 1, wherein at least one of the mixer elements includes a power transistor that receives one of the reference signals as input.

4. The power amplifier of claim 1, wherein the quadrature mixer includes a Gilbert cell optimized for power-handling capabilities.

5. The power amplifier of claim 3, wherein the power transistor includes a dual-gate FET.

6. The power amplifier of claim 3, wherein at least one of the mixer elements has a modulating port driven by the reference signal and a reference port driven by the in-phase or quadrature component of the baseband signal.

7. The power amplifier of claim 6, wherein the reference port is biased to act as an ON/OFF switch.

8. The power amplifier of claim 1, wherein the predetermined low impedance inputs are 50 ohms of impedance and the relatively high impedance inputs are much greater than the predetermined low impedance inputs.

9. The power amplifier of claim 7, wherein the modulating port is biased to act as a current source.

10. The power amplifier of claim 1, wherein each of the mixer elements is configured to operate as a controlled current source coupled to an ON/OFF switch.

11. The power amplifier of claim 10, wherein the ON/OFF switch is a power device.

12. The power amplifier of claim 1, comprising four mixer elements, each of which is configured to receive one of a group of signals representing the in-phase, negative in-phase, quadrature, and negative quadrature components of the baseband signal.

13. The power amplifier of claim 12, wherein the oscillator circuit is configured to produce four reference signals, three of which are 90°, 180°, and 270° out of phase with respect to the other.

14. The power amplifier of claim 13, wherein the oscillator circuit includes a four-phase, ¼-wavelength branch tap to generate the four reference signals.

15. A wireless transmitter for transmitting an amplified RF signal comprising:
   (a) a baseband encoder that receives digital information and produces signals at a baseband centered frequency representing an in-phase (I) component and a quadrature (Q) component of a baseband signal to be transmitted;
   (b) an oscillator circuit configured to generate reference signals at an RF frequency that are 90° out of phase with respect to each other; and
   (c) a quadrature mixer having:
      (1) a plurality of mixer elements forming a final gain stage of the wireless transmitter, each connected to the oscillator circuit to receive one of the reference signals with inputs of predetermined low impedance and connected to the baseband encoder to receive one of the components of the baseband signal with inputs of relatively high impedance, each mixer element configured to operate as both a mixer and an amplifier using at least one of the reference signals to simultaneously modulate and impart conversion gain to the in-phase or the quadrature component of the baseband signal; and
      (2) combining circuitry tuned to maximize the overall power conversion efficiency of the quadrature mixer, the combining circuitry configured to combine the modulated and amplified I and Q components to form the amplified RF signal.

16. The wireless transmitter of claim 15, wherein the reference signals have power levels much greater than the power levels of the I and Q components of the baseband signal.

17. The wireless transmitter of claim 15, wherein at least one of the mixer elements includes a power transistor that receives one of the reference signals as input.

18. The power amplifier of claim 15, wherein the quadrature mixer includes a Gilbert cell optimized for power-handling capabilities.

19. The wireless transmitter of claim 17, wherein the power transistor includes a dual-gate FET.

20. The wireless transmitter of claim 17, wherein at least one of the mixer elements has a modulating port driven by the reference signal and a reference port driven by the in-phase or quadrature component of the baseband signal.

21. The wireless transmitter of claim 20, wherein the reference port is biased to act as an ON/OFF switch.

22. The wireless transmitter of claim 21, wherein the modulating port is biased to act as a current source.

23. The wireless transmitter of claim 15, further comprising an element configured to produce four baseband signals representing the in-phase and inverted in-phase components and the quadrature and inverted quadrature components of the baseband signal.

24. The wireless transmitter of claim 23, comprising four mixer elements, each of which is configured to receive one of the four baseband signals.

25. The wireless transmitter of claim 23, wherein the oscillator circuit is configured to produce four reference signals, three of which are 90°, 180°, and 270° out of phase with respect to the other.

26. The wireless transmitter of claim 25, wherein the oscillator circuit includes a four-phase, ¼-wavelength branch tap to generate the four reference signals.

27. The wireless transmitter of claim 15, further comprising a low-loss combiner coupled to the quadrature mixer elements.

28. The wireless transmitter of claim 27, wherein the low-loss combiner includes a ceramic substrate.

29. A method for amplifying a baseband signal to be transmitted over a wireless network, the method comprising:
   (a) providing amplified reference signals at an RF frequency that are 90° out of phase with respect to each other to inputs of a quadrature mixer with predetermined low impedance;

(b) providing an in-phase (I) and quadrature (Q) component of the baseband signal at a baseband centered frequency to inputs of the quadrature mixer with relatively high impedance;

(c) operating the quadrature mixer as a both a final gain stage and a mixer such that at least one of the reference signals upconverts and at the same time amplifies the in-phase and the quadrature components of the baseband signal; and (d) combining the upconverted and amplified I and Q components to form an output signal.

30. The method of claim 29, comprising providing at least one of the reference signals to a power transistor in the quadrature mixer.

31. The method of claim 30, wherein providing at least one of the reference signals to a power transistor includes providing the reference signal to a dual-gate FET.

32. The method of claim 30, further comprising driving a modulating port of the quadrature mixer with one of the reference signals and driving a reference port with either the in-phase or the quadrature component of the baseband signal.

33. The method of claim 32, further comprising biasing the reference port to act as an ON/OFF switch.

34. The method of claim 32, further comprising biasing the modulating port to act as a variable current source.

35. The method of claim 29, wherein the quadrature mixer includes four mixer elements.

36. The method of claim 35, comprising providing one of a group of signals to each of the mixer elements, where the group includes signals representing the in-phase and inverted in-phase components and the quadrature and inverted quadrature components of the baseband signal.

37. The method of claim 36, comprising providing one of four reference signals to each of the mixer elements, where three of the reference signals are 90°, 180°, and 270° out of phase with respect to another of the reference signals.

38. The method of claim 37, further comprising using a four-phase, ¼-wavelength branch tap to generate the reference signals.

39. The power amplifier of claim 1, wherein the combining circuitry is tuned to increase output power conversion efficiency of the quadrature mixer and reduce the appearance of amplifier output harmonics from the quadrature mixer.

40. The method of claim 29 further comprising the initial step of tuning combining circuitry within the quadrature mixer to increase output power conversion efficiency of the quadrature mixer and reduce the appearance of amplifier output harmonics from the quadrature mixer during the performance of (d).

41. A power mixer for generating an amplified signal from an in-phase (I) component and a quadrature (Q) component of a baseband signal, the power mixer comprising:

an oscillator circuit configured to generate a reference signal; and a quadrature mixer electrically connected with the oscillator circuit, comprising:

a dual port transistor that receives the reference signal at an RF frequency with a predetermined low impedance input and the baseband signal at a baseband centered frequency with a relatively high impedance input, wherein the dual port transistor is operable as both a mixing stage and a final stage conversion gain to modulate and amplify versions of the in-phase (I) component and the quadrature (Q) component.

42. The power mixer of claim 41, further comprising a signal combiner electrically connected with the dual port transistor, the signal combiner being operable to combine the modulated and amplified versions of the in-phase (I) component and the quadrature (Q) component to form the amplified signal.

43. The power amplifier of claim 42, wherein the signal combiner is tuned to increase output power conversion efficiency of the quadrature mixer and reduce the appearance of amplifier output harmonics from the quadrature mixer.

44. The power mixer of claim 41, wherein the dual port transistors form a plurality of mixers.

45. The power mixer of claim 41, wherein the dual port transistors are field effect transistors.

46. The power mixer of claim 41, wherein the dual port transistors are bipolar transistors.

47. The power mixer of claim 41, wherein the dual port transistors are HEMTs.

48. The power mixer of claim 41, wherein the dual port transistors form a Gilbert cell scaled for power-handling capabilities.

49. The power mixer of claim 41, wherein the dual port transistors are preceded by a plurality of gain stages in a cascade configuration.

50. The power mixer of claim 41, wherein the versions of the in-phase (I) component and the quadrature (Q) component comprise direct versions of the in-phase (I) component and the quadrature (Q) component.

51. The power mixer of claim 41, wherein the versions of the in-phase (I) component and the quadrature (Q) component comprise direct and inverted versions of the in-phase (I) component and the quadrature (Q) component.

52. A method of amplifying a baseband signal for transmission as an amplified RF signal, the method comprising:

providing signals at a baseband centered frequency to a relatively high impedance input of a quadrature mixer that are versions of an in-phase (I) component and a quadrature (Q) component representing the baseband signal;

amplifying a reference signal;

providing the amplified reference signal at an RF frequency to a predetermined low impedance input of the quadrature mixer;

simultaneously performing a final stage of amplification and modulation of the versions of the in-phase (I) component and the quadrature (Q) component with the quadrature mixer using the amplified reference signal;

combining the modulated and amplified versions of the in-phase (I) component and the quadrature (Q) component to form the amplified RF signal; and optimizing power conversion efficiency during the combination with a combining circuit.

53. The method of claim 52, further comprises the initial act of tuning the combining circuit to increase output power conversion efficiency and reduce the appearance of amplifier output harmonics.

54. The method of claim 52, further comprising providing gain to the reference signals prior to the final stage of modulation and amplification.

55. The method of claim 52, further comprising generating direct versions of the in-phase (I) component and the quadrature (Q) component.

56. The method of claim 52, further comprising generating direct and inverted versions of the in-phase (I), component and the quadrature (Q) component.

* * * * *